United States Patent
Yang et al.

(10) Patent No.: US 11,965,920 B1
(45) Date of Patent: Apr. 23, 2024

(54) METHOD FOR ACHIEVING TERMINAL-PAIR DEFINITION OF FOUR-TERMINAL-PAIR IMPEDANCE AND APPLICATION THEREOF

(71) Applicant: National Institute of Metrology, China, Beijing (CN)

(72) Inventors: Yan Yang, Beijing (CN); Lu Huang, Beijing (CN); Dongxue Dai, Beijing (CN); Wei Wang, Beijing (CN); Xia Liu, Beijing (CN)

(73) Assignee: NATIONAL INSTITUTE OF METROLOGY, CHINA, Beijing (CN)

( * ) Notice: Subject to any disclaimer, the term of this patent is extended or adjusted under 35 U.S.C. 154(b) by 0 days.

(21) Appl. No.: 18/502,153

(22) Filed: Nov. 6, 2023

(30) Foreign Application Priority Data

Nov. 7, 2022 (CN) .......................... 202211383646.3

(51) Int. Cl.
*G01R 27/08* (2006.01)
*G01R 15/04* (2006.01)

(52) U.S. Cl.
CPC .............. *G01R 27/08* (2013.01); *G01R 15/04* (2013.01)

(58) Field of Classification Search
CPC ........ G01R 27/00; G01R 27/02; G01R 27/08; G01R 27/26; G01R 27/2605; G01R 27/2611; G01R 15/00; G01R 15/04
USPC .................................. 324/600, 649, 658, 691
See application file for complete search history.

(56) References Cited

U.S. PATENT DOCUMENTS

| 6,054,867 A * | 4/2000 | Wakamatsu ........... G01R 27/02 |
| | | 324/76.79 |
| 11,764,779 B2 * | 9/2023 | Huang ................... H03H 11/28 |
| | | 327/527 |
| 2023/0349961 A1 * | 11/2023 | Wang ................... G01R 17/105 |

FOREIGN PATENT DOCUMENTS

| CN | 113419097 A | | 9/2021 | |
| JP | 04343075 A | * | 11/1992 | ............. G01R 27/02 |

OTHER PUBLICATIONS

Lei Lai et al., "Quasi-Balance Four-Terminal Resistance Bridge", IEEE Transactions on Instrumentation and Measurement, Sep. 21, 2021, pp. 1636-1641, vol. 64, Issue 6.
CNIPA, Notification of First Office Action for CN202211383646.3, dated Jun. 21, 2023.

(Continued)

*Primary Examiner* — Hoai-An D. Nguyen
(74) *Attorney, Agent, or Firm* — Zhigang Ma

(57) ABSTRACT

A method for achieving terminal-pair definition of four-terminal-pair (4TP) impedance and an application thereof are provided, which belongs to the field of precision measurement and metrology. A current output terminal of a two-stage follower is connected to a high current terminal of impedance through a coaxial line, and a voltage output terminal of the two-stage follower is connected to a high voltage terminal of the impedance through the coaxial line, which makes current of the high voltage terminal be 0, and core wire currents and outer wire currents of the high current terminal equal and reverse. The terminal-pair definition of the 4TP impedance can be satisfied; and the follower is added to make a bridge ratio variable and isolate effects of bridge load changes, thereby accelerating a balancing speed of the 4TP impedance bridge, and achieving accurate and fast comparative measurement having high precision of the 4TP AC impedance.

3 Claims, 3 Drawing Sheets

(56) References Cited

OTHER PUBLICATIONS

National Institute of Metrology, China (Applicant), Reply to Notification of First Office Action for CN202211383646.3, w/ replacement claims, dated Jun. 27, 2023.
National Institute of Metrology, China (Applicant), Supplemental Reply to Notification of First Office Action for CN202211383646.3, w/ (allowed) replacement claims, dated Sep. 13, 2023.
CNIPA, Notification to grant patent right for invention in CN202211383646.3, dated Sep. 15, 2023.

\* cited by examiner ns with the order of $10^{-8}$ to $10^{-9}$,

METHOD FOR ACHIEVING TERMINAL-PAIR DEFINITION OF FOUR-TERMINAL-PAIR IMPEDANCE AND APPLICATION THEREOF

TECHNICAL FIELD

The present disclosure belongs to the field of precision measurement and metrology, relates to a method for achieving comparative measurement of four-terminal-pair (4TP) impedance by using an alternating current (AC) bridge in electromagnetic metrology, and more particularly to a method for achieving terminal-pair definition of 4TP impedance and an application thereof used to improve a balance speed of this bridge.

BACKGROUND

AC impedance are fundamental electrical quantities, which includes capacitance, resistance and inductance, and their units farad (F), ohm (Ω), and henry (H) are important derived units in the international system of units (SI). Accurate traceability of the AC impedance involves demands of various fields such as energy, materials, aerospace and military industry.

An accurate comparative measurement for dissemination of the value of quantity (i.e., quantity value) of impedance needs an accurate definition of the AC impedance and an accurate AC bridge technology. A traditional definition of impedance based on terminals and a classic AC bridge technology are no longer able to satisfy accuracy requirements for dissemination of the value of quantity of the impedance. Therefore, researchers propose an AC impedance definition of two-terminal-pair impedance and a measurement technology of a two-terminal-pair AC bridge, an AC impedance definition method based on terminal-pair (i.e., a coaxial port) is introduced by introducing shielding on a basis of a two-terminal-pair (i.e., two-wire) impedance definition.

A disadvantage of the two-terminal-pair impedance definition is that a measuring lead wire still participate in the definition of the impedance. In order to eliminate an effect of the measuring lead wire, the researchers further propose a definition of 4TP AC impedance, and develop a measurement technology for a 4TP AC bridge with high-precision, which makes it possible for dissemination of the value of quantity of the AC impedance with the order of $10^{-8}$ to $10^{-9}$, a series of high-accuracy AC impedance bridges based on induction ratios are formed, which promotes a rapid development of the whole precision electromagnetic measurement technology.

The definition of the 4TP improves the definition of the AC impedance. However, in order to achieve a definition structure of the astatic 4TP AC impedance, a complexity of the AC bridge will be greatly increased, and balance conditions will increase. When using this kind of 4TP bridge to measure, it needs to be adjusted repeatedly, which is time-consuming and cumbersome. Moreover, a bridge operation has a high requirement on measurement operators, which is easy to cause bridge balance error, affect a measurement accuracy of the AC impedance, and is not conducive to a promotion of such measuring instruments.

SUMMARY

A purpose of the present disclosure is to solve problems existing in the relate art, and provide a method for achieving terminal-pair definition of 4TP impedance and an application thereof, to thereby automatically achieve the 4TP definition of compared impedance of a 4TP impedance bridge, and accurate comparative measurement of AC impedance can be achieved through simply completing a main balance of a bridge, which greatly increases a convergence speed of the 4TP impedance bridge, and achieves a fast comparative measurement of the 4TP impedance.

The present disclosure is achieved through the following technical solutions.

According to a fist aspect of the present disclosure, a method for achieving terminal-pair definition of 4TP impedance is provided, and the method includes: connecting a current output terminal of a two-stage follower to a high current terminal of impedance through a coaxial line, and connecting a voltage output terminal of the two-stage follower to a high voltage terminal of the impedance through the coaxial line, to thereby make a current of the high voltage terminal of the impedance be zero, and a core wire current and an outer wire current of the high current terminal equal and reverse.

In an embodiment, the two-stage follower includes: a first follower $F_1$, a second follower $F_2$ and a third follower $F_3$; and the first follower $F_1$ is a first-stage follower, the second follower $F_2$ and the third follower $F_3$ are combined to be a second-stage follower;

a power supply $\pm V_{cc}$ of the first-stage follower and a power supply $\pm V_{cc2}$ of the second-stage follower are independent of each other, and an output terminal of the first follower $F_1$ is connected to a center point of the power supply $\pm V_{cc2}$ of the second-stage follower; and
an output terminal of the second follower $F_2$ is connected to a non-inverting input terminal of the third follower $F_3$.

In an embodiment, the method further includes: connecting an input terminal $V_{Input}$ of the two-stage follower to a non-inverting input terminal of the first follower $F_1$ and a non-inverting input terminal of the second follower $F_2$, individually, and connecting the input terminal $V_{Input}$ of the two-stage follower to an outer wire of the input terminal $V_{Input}$ through an input resistance $R_{in}$;

connecting an output terminal of the third follower $F_3$ to the current output terminal $I_{out}$ of the two-stage follower, and connecting an inverting input terminal of the second follower $F_2$ to the voltage output terminal $V_{out}$ of the two-stage follower;
connecting an outer wire of the current output terminal $I_{out}$ of the two-stage follower to a center point of the power supply $\pm V_{cc}$ of the first-stage follower; and
connecting an outer wire of the voltage output terminal $V_{out}$ of the two-stage follower to the outer wire of the input terminal $V_{Input}$ of the two-stage follower.

In an embodiment, the method further includes: connecting a core wire of the current output terminal $I_{out}$ of the two-stage follower to a core wire of the voltage output terminal $V_{out}$ of the two-stage follower through a first resistance $R_1$, and connecting the outer wire of the current output terminal $I_{out}$ of the two-stage follower to the outer wire of the voltage output terminal $V_{out}$ of the two-stage follower through a second resistance $R_2$.

According to a second aspect of the present disclosure, a method for achieving fast comparative measurement of a 4TP impedance bridge is provided, and the method uses the above method for achieving terminal-pair definition of 4TP impedance to achieve the fast comparative measurement of the four terminal-pair impedance bridge.

In an embodiment, the method for achieving fast comparative measurement of the 4TP impedance bridge includes:

connecting a high current terminal $C_{H1}$ of first impedance $Z_1$ to a current output terminal of a first two-stage follower $F_{Z1}$, and connecting a high voltage terminal $P_{H1}$ of the first impedance $Z_1$ to a voltage output terminal of the first two-stage follower $F_{Z1}$; connecting an input terminal of the first two-stage follower $F_{Z1}$ to a ratio output tap of a ratio induction voltage divider through a switch connection, to thereby make a bridge ratio variable; and connecting a low voltage terminal $P_{L1}$ of the first impedance $Z_1$ to a high terminal of a Kelvin balance;

connecting a high current terminal $C_{H2}$ of second impedance $Z_2$ to a current output terminal of a second two-stage follower $F_{Z2}$, and connecting a high voltage terminal $P_{H2}$ of the second impedance $Z_2$ to a voltage output terminal of the second two-stage follower $F_{Z2}$; and connecting a low voltage terminal $P_{L2}$ of the second impedance $Z_2$ to a low terminal of the Kelvin balance; and connecting an input terminal of the second two-stage follower $F_{Z2}$ to the ratio induction voltage divider after connecting the input terminal of the second two-stage follower $F_{Z2}$ in series with a differential signal injection transformer.

Compared to the related art, beneficial effects of the present disclosure are the follows.

The present disclosure can automatically satisfy the terminal-pair definition of the 4TP impedance; in the present disclosure, the follower is added to make the bridge ratio variable and isolate an effect of bridge load changes in the 4TP impedance bridge, thereby accelerating a balancing speed of the 4TP impedance bridge, and achieving accurate and fast comparative measurement having variable ratio and high precision of the 4TP AC impedance.

DETAILED DESCRIPTION OF EMBODIMENTS

The present disclosure will be described in detail in conjunction with drawings below.

Figure 1:
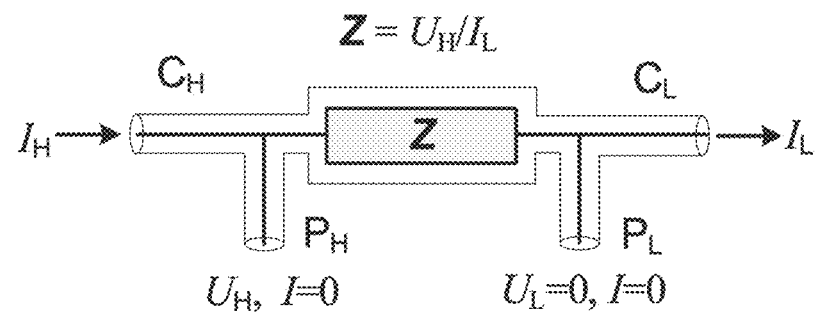
FIG. 1 illustrates a schematic diagram of a definition of 4TP impedance according to an embodiment of the present disclosure.

A principle of a terminal-pair definition of 4TP impedance is shown in FIG. 1, impedance satisfies definition conditions of 4TP impedance and the 4TP impedance is defined as $Z=U_H/I_L$ when voltages and currents of four terminals of the impedance satisfy the following conditions: a current of a high voltage terminal $U_H$ is 0, a voltage and a current of a low voltage terminal $U_L$ are 0, a current of a high current terminal $C_H$ is $I_H$, and a current of a low current terminal $C_L$ is $I_L$.

In order to satisfy the definition conditions of the impedance, in a measurement circuit of the impedance, the definition conditions of the impedance are achieved by a method of configuring a power supply with adjustable amplitude and phase on a current terminal, and configuring a detector (NI) on a voltage terminal to measure flowed current. A high voltage terminal, a high current terminal, a low voltage terminal and a low current terminal of the measured impedance respectively satisfy the above definition conditions of 4TP impedance through adjusting an output of the power supply and combining the detector to determine. However, the measurement process needs to repeatedly adjust the output of the power supply, and to perform a null-pointing judgement, which leads to complicated steps and long period of the measurement of the 4TP impedance.

The astatic construction (metrological noun) is adopted to minimize an influence of mutual inductance coupling of an alternating current (AC) measurement circuit, therefore, an astatic characteristic of the measurement circuit needs to be ensured to achieve the definition of the 4TP AC impedance, that is, when a core wire current and an outer wire current (i.e., a current in a core wire of the coaxial wire and a current in an outer wire (i.e., shielding layer) of a coaxial line) of the coaxial line in the current terminal of the 4TP impedance are equal and reverse, magnetic fields generated by the core wire current and the outer wire current are offset outside the coaxial line, and no leakage magnetic field is presented. Meanwhile, terminal voltages are not affected by an external interference magnetic field. In the measurement circuit, the astatic construction needs to ensure that a core wire current and an outer wire current in each mesh (i.e., a minimum loop, which is a noun in circuit theory) of the circuit are equal and reverse.

A general method at present is to add a choke in a coaxial line mesh where an outer wire of the coaxial line is short circuited (i.e., the coaxial line is twined on a bracelet ring magnetic core) to ensure the above astatic requirements. In order to ensure the effect, the coaxial line needs to be twined on a magnetic core for 10-20 turns, which may lead to an increase of a length of a lead wire.

Figure 2:
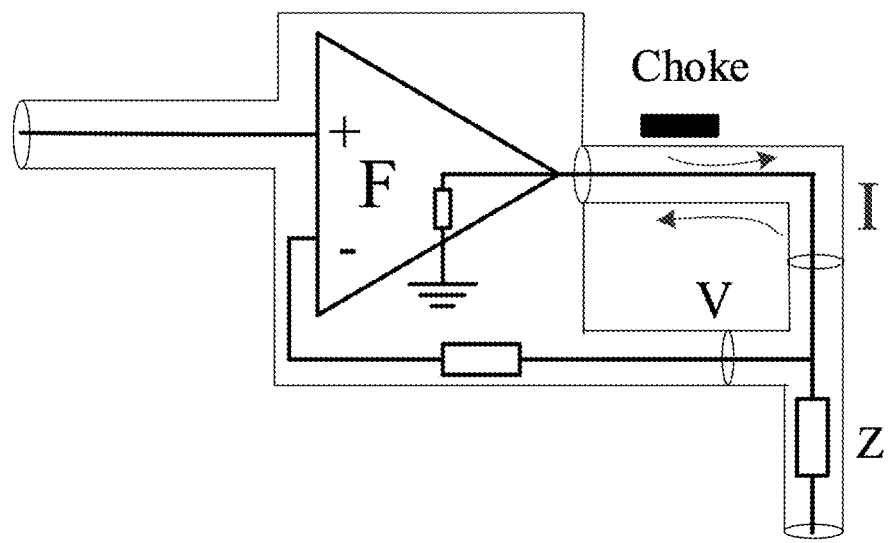
FIG. 2 illustrates a schematic diagram of using a follower to meet terminal-pair definition of impedance in the related art.

When the measured impedance Z satisfies the terminal-pair definition, an output terminal and a feedback terminal of a voltage follower can be used to be a current terminal and a voltage terminal of a terminal of the measured impedance, respectively. Specifically, as shown in FIG. 2, the output terminal of the voltage follower is connected to a high current terminal of the impedance through the coaxial line, an inverting input terminal of the voltage follower is connected to a high voltage terminal of the impedance through the coaxial line, and the output terminal and the inverting input terminal of the voltage follower are closed at a connection of the current terminal and the voltage terminal of the impedance to form a follower feedback loop. An astatic design (e.g., add the choke) of the circuit ensures that the core wire current and the outer wire current of the current terminal are equal and reverse. The feedback terminal of the follower does not have current and only provides a potential, and a definition requirement of the voltage terminal of the impedance is automatically satisfied.

A black thin solid line in FIG. 2 is the outer wire of the coaxial line connected with an outer shell of the voltage follower, and both are connected to a signal reference ground. A black thick solid line in FIG. 2 is a signal wire and the core wire of the coaxial line. Elliptical circles in FIG. 2 represent ports, that is, coaxial ports, which are coaxial terminals installed on a panel, and is connected to other ports through the coaxial line.

An ideal voltage follower can achieve a definition of a voltage terminal and a current terminal for four-wire resistors. However, from a perspective of the terminal-pair definition of the impedance, it is also necessary to consider a flow of the outer wire current. Therefore, a single voltage follower has the disadvantages of insufficient following accuracy and high output impedance.

Figure 3:
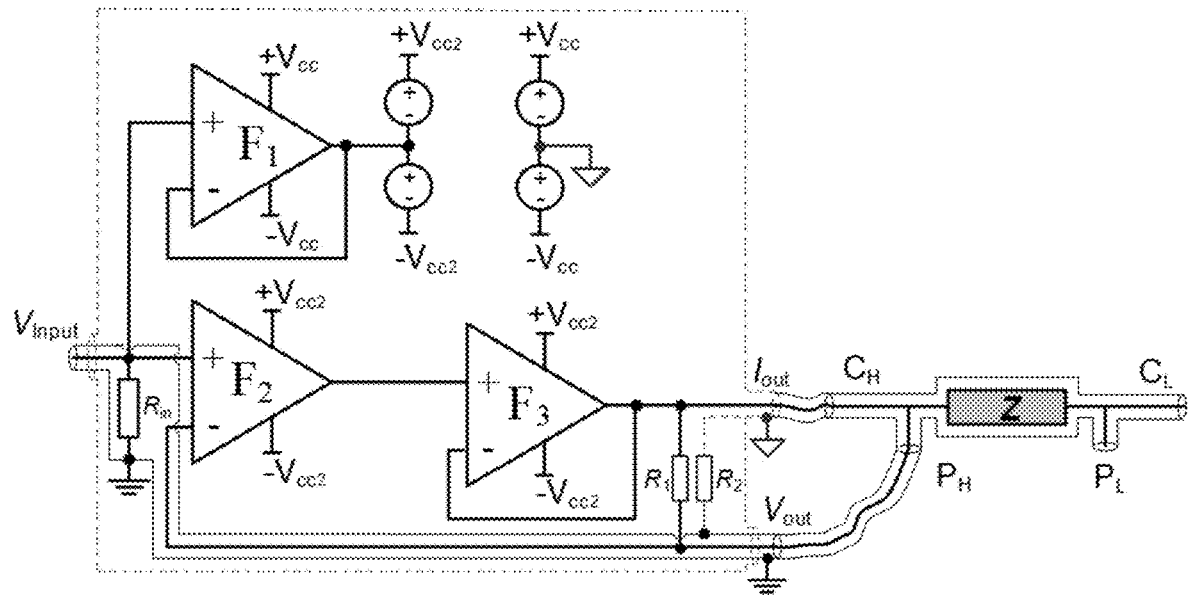
FIG. 3 illustrates a schematic diagram of a method for achieving terminal-pair definition of 4TP impedance according to an embodiment of the present disclosure.

The follower is used to achieve the measurement of the 4TP impedance, which requires the follower to have extremely high following accuracy and extremely low output impedance. The present disclosure adopts a two-stage follower with a buffer structure as a high accuracy follower. As shown in FIG. 3, the two-stage follower includes a first follower $F_1$, a second follower $F_2$ and a third follower $F_3$. The first follower $F_1$ is a first-stage follower, the second follower $F_2$ and the third follower $F_3$ are combined to be a second-stage follower. A power supply of the second follower $F_2$ and a power supply of the third follower $F_3$ are a same power supply $\pm V_{cc2}$, and the second follower $F_2$ and the third follower $F_3$ are combined to form a follower with low output impedance, therefore, a combination of the second follower $F_2$ and the third follower $F_3$ forms the second-stage follower.

A power supply $\pm V_{cc}$ of the first-stage follower and the power supply $\pm V_{cc2}$ of the second-stage follower are independent of each other, and an output terminal of the first follower $F_1$ is connected to a center point of the power supply $\pm V_{cc2}$ of the second-stage follower.

Since the power supply $\pm V_{cc2}$ of the second-stage follower and the power supply $\pm V_{cc}$ of the first-stage follower are independent (i.e., isolated) of each other, a potential of the center point of the power supply $\pm V_{cc2}$ of the second-stage follower is changed with a floating of an input signal, that is, the potential of the center point of the power supply $\pm V_{cc2}$ of the second-stage follower is floatable relative to a ground potential. A following signal of the second-stage follower is obtained by subtracting an output signal of the first-stage follower from the input signal and adding into a final output signal of the second-stage follower, thus compensating a following error introduced by the first-stage follower through the second-stage follower, and a voltage following accuracy of the order of $10^{-7}$ can be achieved within an audio range, so as to achieve high accuracy voltage following.

An output terminal of the second follower $F_2$ is connected to a non-inverting input terminal of the third follower $F_3$, the third follower $F_3$ is achieved through a follower circuit, output impedance of the third follower $F_3$ is already low through a close-loop feedback, and when the third follower $F_3$ is combined with the second follower $F_2$ to form the second-stage follower, final output impedance is further decreased through a close-loop negative feedback, so that the output impedance is decreased by using the third follower $F_3$, which makes the output impedance of the follower circuit smaller than $1\times10^{-5}$ ohms ($\Omega$). The first follower $F_1$, the second follower $F_2$ and the third follower $F_3$ can be achieved by adopting an existing junction field-effect transistor (JFET) precision operational amplifier OPA627.

In an embodiment, an input terminal of the two-stage follower is $V_{Input}$, a current output terminal of the two-stage follower is $I_{out}$, and a voltage output terminal of the two-stage follower is $V_{out}$. The input terminal and the output terminal refer to the coaxial ports, and the coaxial ports include core wires and outer wires. The input terminal connected to another terminal refers to the core wires and the outer wires of the two terminals are respectively connected, and the output terminal is the same.

Specifically, the input terminal $V_{Input}$ of the two-stage follower is connected to a non-inverting input terminal (corresponding to a + end in FIG. 3) of the first follower $F_1$ and a non-inverting input terminal (corresponding to a + end in FIG. 3) of the second follower $F_2$, individually, meanwhile, the input terminal $V_{Input}$ is connected to an outer wire (i.e., reference ground) of the input terminal $V_{Input}$ through an input resistance $R_{in}$, that is, a core wire in a coaxial line of the input terminal $V_{Input}$ is connected to the outer wire of the input terminal $V_{Input}$ through the input resistance $R_{in}$, and the outer wire is connected to ground, which is used to dispose a DC bias of an operational amplifier, the input resistance $R_{in}$ determines an input resistance of the two-stage follower, and the input resistance $R_{in}$ is generally selected as 10 megaohms (M$\Omega$), 100 M$\Omega$ and 500 M$\Omega$ can be also selected according to actual needs.

An output terminal of the third follower $F_3$ is connected to the current output terminal $I_{out}$, an inverting input terminal (corresponding to a – end in FIG. 3) of the second follower $F_2$ is connected to the voltage output terminal $V_{out}$, an outer wire of the current output terminal $I_{out}$ is connected to a center point of the power supply $\pm V_{cc}$ of the first-stage follower, an outer wire of the voltage output terminal $V_{out}$ of the two-stage follower is connected to the outer wire of the input terminal $V_{Input}$, that is voltage reference ground.

A function of the follower is to achieve a current drive of the impedance and accurately follow the input voltage to the voltage terminal of the impedance, therefore, a power supply of the follower needs to provide a driving current. In order to avoid an irregular flow of an outer wire current of the current terminal and an outer wire current of the voltage terminal of the follower, the current terminal and the voltage terminal of the follower need to be disposed separately. A light black dotted line in FIG. 3 is current reference ground, that is, a shielding shell of the two-stage follower and the outer wire of the current output terminal (the shielding shell and the outer wire of the current output terminal are connected as a whole) are connected to the center point (i.e., the current reference ground) of the power supply $\pm V_{cc}$ of the two-stage follower, the black thin solid line is the outer wire of the coaxial line, that is the voltage reference ground, the elliptical circles in FIG. 3 represent the coaxial ports, which are connected to other ports through the coaxial line.

Moreover, when the two-stage follower is not externally connected to a measured impedance Z, the lead wire is not connected between the current output terminal $I_{out}$ and the voltage output terminal $V_{out}$, in the present disclosure, the core wire and the outer wire of the current output terminal $I_{out}$ of the two-stage follower are connected to the core wire and the outer wire of the voltage output terminal $V_{out}$ of the two-stage follower through a first resistance $R_1$ and a second resistance $R_2$, respectively, that is, the core wire of the current output terminal $I_{out}$ is connected to the core wire of the voltage output terminal $V_{out}$ through the first resistance $R_1$, and the outer wire of the current output terminal $I_{out}$ is connected to the outer wire of the voltage output terminal $V_{out}$ through the second resistance $R_2$, so that a feedback loop, the voltage ground and the current ground of the follower are not in an open circuit state through the first resistance $R_1$ and the second resistance $R_2$, so as to ensure a normal operation of $I_{out}$ and $V_{out}$ of the two-stage follower during open circuit, and resistances of $R_1$ and $R_2$ are generally selected as 1 kilo-ohm (k$\Omega$) and 50 $\Omega$.

When the two-stage follower is used to achieve the terminal-pair definition of the impedance, the current output terminal $I_{out}$ of the two-stage follower is connected to a high current terminal $C_H$ of the impedance Z through the coaxial line, the voltage output terminal $V_{out}$ of the two-stage follower is connected to a high voltage terminal $P_H$ of the impedance Z through the coaxial line. Since the core wires and the outer wires of the current output terminal $I_{out}$ t and the voltage output terminal $V_{out}$ are individually shorted at a connection of $C_H$ and $P_H$ of the impedance Z (inside the 4TP impedance, core wires and outer wires of $C_H$ and $P_H$ are individually shorted), the first resistance $R_1$ and the second resistance $R_2$ are short circuited, and a voltage of the input terminal $V_{Input}$ is followed to a definition point of the impedance Z. Definition points of the 4TP impedance are short connection points of the voltage terminal and the current terminal, and the definition points include high terminal definition points and low terminal definition points, in the present disclosure, only high terminal definition points are involved. When the close-loop feedback of the ideal follower is closed at the definition points of the impedance, the input voltage can be accurately followed to output points, that is the definition points of the impedance.

According to the terminal-pair definition of the impedance, the core wire current and the outer wire current of the current terminal of the impedance need to be equal and reverse, and the core wire current and the outer wire current of the voltage terminal need to be 0. Functions of the first resistance $R_1$ and the second resistance $R_2$ are to make the two-stage follower work normally when there is no external impedance. When the two-stage follower is externally connected with the impedance, and the first resistance $R_1$ and the second resistance $R_2$ are removed, the 4TP definition will be automatically satisfied. However, the first resistance $R_1$ and the second resistance $R_2$ are needed, thus settings for resistances of the first resistance $R_1$ and the second resistance $R_2$ need to satisfy certain requirements (e.g., set as 1 kΩ and 50 Ω), vast majority of current still flows between the core wire and the outer wire at the current terminal, and effects of the core wire current and the outer wire current of the voltage terminal can be ignored, which makes the core wire current and the outer wire current of the current output terminal $I_{out}$ t of the two-stage follower equal and reverse, and makes almost no current to flow through the core wire and the outer wire of the voltage output terminal $V_{out}$, so as to achieve the astatic design of the measurement circuit, and solve a problem of must using the choke to achieve the astatic design.

In the present disclosure, the current reference ground and the voltage reference ground of the follower are separated (the light black dotted line in FIG. 3 represents the current reference ground, and the black thin solid line in FIG. 3 represents the voltage reference ground), the current reference ground is connected to the voltage reference ground through the second resistance $R_2$, and the astatic design of the circuit ensures that the core wire current and the outer wire current in the current terminal are equal and reverse. The feedback terminal of the follower has no current and only provides a potential, and satisfying the definition of the voltage terminal of the impedance.

In an embodiment, the present disclosure further provides an application method for achieving a fast comparative measurement of the 4TP impedance bridge by using the above method, that is, two sets of two-stage induction voltage divider terminal-pair definition structure are used to replace two source combination networks in the traditional 4TP impedance bridge, so as to achieve the terminal-pair definition of the compared 4TP impedance.

Figure 4:
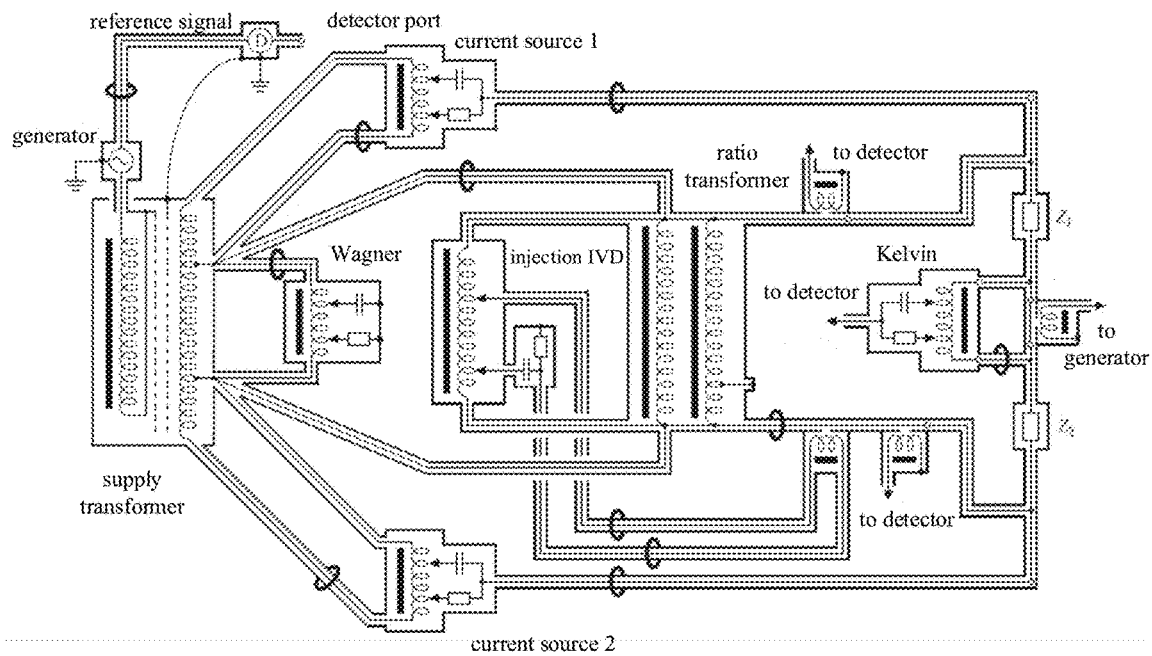
FIG. 4 illustrates a schematic diagram of a 4TP impedance bridge in the related art.

Specifically, a principle of a classic 4TP AC coaxial bridge based on an induction ratio arm (i.e., induction voltage divider) is shown in FIG. 4, in a measurement bridge of the 4TP AC impedance, the definition condition of each terminal-pair of the 4TP impedance needs to be satisfied, thus a load balance needs to be performed on each current terminal-pair and each voltage terminal-pair. As shown in FIG. 4, a whole bridge includes: three induction voltage dividers such as a ratio induction voltage divider, a source induction voltage divider and an injection induction voltage divider, multiple auxiliary balances and source combination networks, multiple chokes, multiple detectors and the like key components. Specifically, a signal generator sends a signal to drive the source induction voltage divider to supply power to the bridge, and a synchronous reference signal of the signal generator is connected to the detector, high and low power supply terminals of the source induction voltage divider are individually connected to high and low power supply terminals of the ratio induction voltage divider and high and low power supply terminals of a Wagner balance, an output of a source combination network 1 is connected to a high current terminal of a first impedance $Z_1$, an output of a source combination network 2 is connected to a high current terminal of a second impedance $Z_2$, a low current terminal $C_{L1}$ of the first impedance $Z_1$ is connected in series with a signal injection transformer and then connected to a low current terminal $C_{L1}$ of the second impedance $Z_2$, a high potential terminal of the first impedance $Z_1$ is connected in series with a detector transformer and then connected to a high terminal of the ratio induction voltage divider, a low potential terminal of the first impedance $Z_1$ is connected to a high terminal of a Kelvin balance, a high potential terminal of the second impedance $Z_2$ is connected in series with a detector transformer and a differential signal injection transformer and then connected to a low terminal of the ratio induction voltage divider, and a low potential terminal of the second impedance $Z_2$ is connected to a low terminal of the Kelvin balance. Auxiliary balancing measures of the bridge include: two terminal-pair definition balance of high terminals of the compared impedance, the Wagner balance and the Kelvin balance. The above four auxiliary balances and a main balance condition of the bridge need to be satisfied by the bridge at the same time, so that one measurement can be completed.

A complexity of the 4TP bridge is made to be more than that of the two-terminal-pair bridge by multiple terminal-pair definition balances and the auxiliary balances. To measure the existing 4TP bridge once, it is necessary to carry out load balance and main balance repeatedly until all the 4TP definition conditions are satisfied, and the operation process is time-consuming and cumbersome.

In the present disclosure, the fast comparative measurement of the 4TP impedance can be achieved by using the above fast achievement method of using a two-stage follower to satisfy the terminal-pair definition of the impedance.

Figure 5:
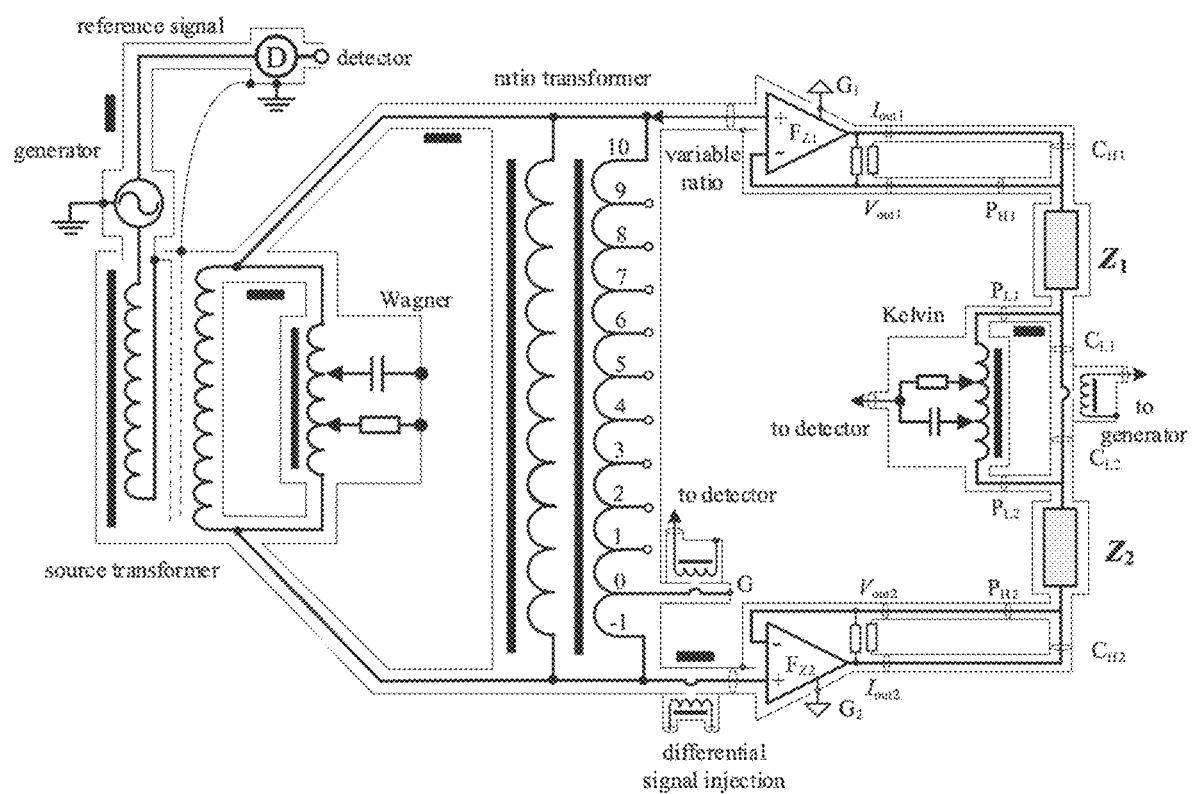
FIG. 5 illustrates a schematic diagram of a 4TP impedance bridge according to an embodiment of the present disclosure.

As shown in FIG. 5, two sets of two-stage followers $F_{Z1}$ and $F_{Z2}$ are used to achieve a terminal-pair definition of high voltage terminals and high current terminals of compared impedance $Z_1$ and $Z_2$ in a 4TP impedance bridge, and the two sets of two-stage followers $F_{Z1}$ and $F_{Z2}$ replace the two sets of the source combination networks in the traditional 4TP bridge, which greatly reduces the complexity of the 4TP bridge. Meanwhile, a bridge device and an external load are isolated by adopting the followers, thus greatly reducing auxiliary balance correlation and balance times of the bridge.

Specifically, a high current terminal $C_{H1}$ of the first impedance $Z_1$ is connected to a current output terminal of the first two-stage follower $F_{Z1}$, a high voltage terminal $P_{H1}$ of the first impedance $Z_1$ is connected to a voltage output terminal of the first two-stage follower $F_{Z1}$, and an input terminal of the first two-stage follower $F_{Z1}$ is connected to a ratio output tap 10 of a ratio induction voltage divider, an addition of the follower isolates a bridge load, and the input terminal of the first two-stage follower $F_{Z1}$ is connected to any ratio output taps (e.g., taps 1-10 in FIG. 5) of the ratio induction voltage divider through a switching connection to form a variable bridge ratio, which greatly increases a measurement range of the 4TP bridge. A low voltage terminal $P_{L1}$ of the first impedance $Z_1$ is connected to a high terminal of a Kelvin balance, a high current terminal $C_{H2}$ of the second impedance $Z_2$ is connected to a current output terminal of the second two-stage follower $F_{Z2}$, a high voltage terminal $P_{H2}$ of the second impedance $Z_2$ is connected to a voltage output terminal of the second two-stage follower $F_{Z2}$, and an input terminal of the second two-stage follower $F_{Z2}$ is connected in series with a differential signal injection transformer and then connected to a ratio output tap −1 of the ratio induction voltage divider; and a low current terminal $C_{L1}$ of the first impedance $Z_1$ is connected to a low current terminal $C_{L2}$ of the second impedance $Z_2$ through a signal injection transformer, a low voltage terminal $P_{L1}$ of the first impedance $Z_1$ is connected to the high terminal of the Kelvin balance (a choke needs to be added to a formed mesh), a low voltage terminal $P_{L2}$ of the second impedance $Z_2$ is connected to a low terminal of the Kelvin balance, when conditions of the Kelvin balance are satisfied, voltages and currents of the low voltage terminal $P_{L1}$ of the first impedance $Z_1$ and the low voltage terminal $P_{L2}$ of the second impedance $Z_2$ are approximately 0, and core wire currents and outer wire currents of the low current terminals $C_{L1}$ and $C_{L2}$ are equal and reverse, so as to satisfy 4TP definitions of the first impedance $Z_1$ and the second impedance $Z_2$. Connection ways of other parts are the same as the existing bridge, that is, a high power supply terminal and a low power supply terminal of the ratio induction voltage divider are individually connected to a high power supply terminal and a low power supply terminal of a Wagner balance, a signal generator sends a signal to drive a source induction voltage divider to supply power to the bridge, a synchronous reference signal of the signal generator is connected to a detector, a high power supply terminal and a low power supply terminal of the source induction voltage divider are individually connected to the high power supply terminal and the low power supply terminal of the ratio induction voltage divider and the high power supply terminal and the low power supply terminal of the Wagner balance.

Verify based on actual operation, the Wagner balance of the power and the Kelvin balance of the detector in the bridge of the present disclosure only need to be balanced once, and there is basically no need to make adjustments. A single measurement of the 4TP bridge can be completed by completing a main balance of the bridge after completing an initial setting of a bridge auxiliary balance, which greatly improves the measurement speed. Under 1 kilohertz (kHz), an uncertainty level of the impedance measurement of the 4TP impedance bridge can reaches $1 \times 10^{-7}$ (k=2).

It is different from a conventional method for achieving the definition of the 4TP impedance by using the source combination network and the detector, the present disclosure proposes a fast achievement method of comparative measurement of the 4TP impedance, and the method can automatically satisfy the 4TP definition of the impedance, the follower is added to isolate an effect of bridge load changes, thereby accelerating a balancing speed of the 4TP impedance bridge, and achieving accurate and fast comparative measurement having high precision of the 4TP AC impedance, and a measurement accuracy of the impedance is merely limited by a following accuracy of a precision follower; and the present disclosure is also applicable to a precision measurement instrument or similar measurement systems for AC parameters.

The terminal-pair definition of the AC impedance is satisfied by adopting the two-stage followers in the present disclosure, the fast comparative measurement of the 4TP impedance is achieved, the present disclosure can be applied in the field of fast automatic measurement of the 4TP impedance, which has a great significance for commercializing a terminal-pair measurement technology and improving performances of metrological instruments.

The above technical solution is merely an embodiment of the present disclosure, for those skilled in the art, it is easy to make various types of improvements or deformations based on principles disclosed in the present disclosure, which are not limited to the technical solution described in the specific embodiments of the present disclosure. Therefore, the previous description is only exemplary and does not have restrictive significance.

What is claimed is:

1. A method for achieving terminal-pair definition of four-terminal-pair (4TP) impedance, comprising:
    connecting a current output terminal of a two-stage follower to a high current terminal of impedance through a coaxial line, and connecting a voltage output terminal of the two-stage follower to a high voltage terminal of the impedance through the coaxial line, to thereby make a current of the high voltage terminal of the impedance be zero, and a core wire current and an outer wire current of the high current terminal equal and reverse;
    wherein the two-stage follower comprises: a first follower $F_1$, a second follower $F_2$ and a third follower $F_3$; and the first follower $F_1$ is a first-stage follower, the second follower $F_2$ and the third follower $F_3$ are combined to be a second-stage follower;
    wherein a power supply $\pm V_{cc}$ of the first-stage follower and a power supply $\pm V_{cc2}$ of the second-stage follower are independent of each other, and an output terminal of the first follower $F_1$ is connected to a center point of the power supply $\pm V_{cc2}$ of the second-stage follower;
    wherein the method further comprises:
    connecting an output terminal of the second follower $F_2$ to a non-inverting input terminal of the third follower $F_3$;
    connecting a core wire of the current output terminal $I_{out}$ of the two-stage follower to a core wire of the voltage output terminal $V_{out}$ of the two-stage follower through a first resistance $R_1$, and connecting an outer wire of the current output terminal $I_{out}$ to an outer wire of the voltage output terminal $V_{out}$ through a second resistance $R_2$;
    connecting an input terminal $V_{Input}$ of the two-stage follower to a non-inverting input terminal of the first follower $F_1$ and a non-inverting input terminal of the second follower $F_2$, individually, and connecting the input terminal $V_{Input}$ of the two-stage follower to an outer wire of the input terminal $V_{Input}$ through an input resistance $R_{in}$, that is, connecting the input terminal $V_{Input}$ of the two-stage follower to reference ground through the input resistance $R_{in}$;

connecting an output terminal of the third follower $F_3$ to the current output terminal $I_{out}$ of the two-stage follower, and connecting an inverting input terminal of the second follower $F_2$ to the voltage output terminal $V_{out}$ of the two-stage follower;

connecting the outer wire of the current output terminal $I_{out}$ of the two-stage follower to a center point of the power supply $\pm V_{cc}$ of the first-stage follower; and connecting the outer wire of the voltage output terminal $V_{out}$ of the two-stage follower to the outer wire of the input terminal $V_{Input}$.

2. A method for achieving comparative measurement of a 4TP impedance bridge, comprising: applying the method for achieving terminal-pair definition of 4TP impedance as claimed in claim 1 to achieve the comparative measurement of the 4TP impedance bridge.

3. The method for achieving the comparative measurement of the 4TP impedance bridge as claimed in claim 2, wherein the method comprises:

connecting a high current terminal $C_{H1}$ of first impedance $Z_1$ to a current output terminal of a first two-stage follower $F_{Z1}$, and connecting a high voltage terminal $P_{H1}$ of the first impedance $Z_1$ to a voltage output terminal of the first two-stage follower $F_{Z1}$; connecting an input terminal of the first two-stage follower $F_{Z1}$ to a ratio output tap of a ratio induction voltage divider through a switch connection, to thereby make a bridge ratio variable; and connecting a low voltage terminal $P_{L1}$ of the first impedance $Z_1$ to a high terminal of a Kelvin balance;

connecting a high current terminal $C_{H2}$ of second impedance $Z_2$ to a current output terminal of a second two-stage follower $F_{Z2}$, and connecting a high voltage terminal $P_{H2}$ of the second impedance $Z_2$ to a voltage output terminal of the second two-stage follower $F_{Z2}$; and connecting a low voltage terminal $P_{L2}$ of the second impedance $Z_2$ to a low terminal of the Kelvin balance; and connecting an input terminal of the second two-stage follower $F_{Z2}$ to the ratio induction voltage divider after connecting the input terminal of the second two-stage follower $F_{Z2}$ in series with a differential signal injection transformer.

\* \* \* \* \*